United States Patent [19]

Furukawa et al.

[11] Patent Number: 5,246,804
[45] Date of Patent: Sep. 21, 1993

[54] METHOD OF RETOUCHING PATTERN

[75] Inventors: Tadahiro Furukawa; Toshiaki Kikuchi; Hitoshi Konno, all of Tokyo, Japan

[73] Assignee: Kyodo Printing Co., Ltd., Tokyo, Japan

[21] Appl. No.: 924,612

[22] Filed: Aug. 3, 1992

Related U.S. Application Data

[63] Continuation of Ser. No. 460,075, Mar. 12, 1990, abandoned.

Foreign Application Priority Data

Nov. 8, 1988 [JP] Japan .................................. 63-282083

[51] Int. Cl.$^5$ .......................... C09K 19/00; G02F 1/03
[52] U.S. Cl. .......................................... 430/20; 430/5; 430/320; 430/322; 430/324; 430/329; 430/331; 430/945; 356/237; 427/140
[58] Field of Search ................. 430/5, 7, 30, 320, 322, 430/324, 327, 329, 331, 945; 356/237; 427/140

[56] References Cited

U.S. PATENT DOCUMENTS 4,925,755  5/1990  Yamaguchi et al. .................... 430/5

*Primary Examiner*—Marion E. McCamish
*Assistant Examiner*—S. Rosasco
*Attorney, Agent, or Firm*—Kane, Dalsimer, Sullivan, Kurucz, Levy, Eisele, and Richard

[57] ABSTRACT

The invention relates to a technique for retouching a pattern which is formed on one side of a substrate and which partially has defects. A method of retouching the pattern, according to the invention, comprises coating the one side of the substrate including the pattern, with a retouching protective membrane, exposing the one side of the substrate, with reference to portions having defects, filling the portions of the exposed one side of the substrate, with retouching material, and removing the retouching protective membrane. One of the retouching protective membrane and the retouching material is made of water-soluble material, while the other is made of oil-soluble material.

10 Claims, 2 Drawing Sheets

METHOD OF RETOUCHING PATTERN

This is a continuation of copending application Ser. No. 07/460,075 filed on Mar. 12, 1990, now abandoned.

TECHNICAL FIELD

The present invention relates to a technique for retouching a pattern which is formed on one side of a substrate and which has partially defects and, more particularly, to a technique which is effectively utilized in retouching of a relatively thick pattern having its thickness of the order of 0.5 $\mu m \sim 1.5$ $\mu m$ or more, for example. Accordingly, this invention is directed to a technique more suitable for retouching of a color filter in a color liquid-crystal display panel and so on, for example, rather than a photomask which is used in manufacturing of a semiconductor device or the like.

BACKGROUND ART

Generally, a way of thinking is known in which defects on a photomask are retouched. The necessity of the retouching increases as the photomask increases in area.

The way of thinking, in which the pattern on the photomask is retouched, is also applied to retouching of other pertinent fields, for example, a color filter or the like in a color liquid-crystal display panel. However, such techniques are common to each other in retouching of a pattern which is formed on one side of a substrate and which has partially defects.

For instance, Japanese Patent Unexamined Publication (Kokai) No. SHO 54-32978 discloses such a technique that, primarily in retouching of pattern defects of the photomask, a protective membrane or layer is formed at least on the pattern surface of the side of the substrate prior to illumination of a laser, and the illumination of the laser is done such a condition that the side of the substrate is protected, whereby portions of the protective layer are prevented from scattering and from adhering to the remaining portions of the protective layer so that the remaining portions form new defects. In addition, Japanese Patent Unexamined Publication (Kokai) No. SHO 62-191804 discloses such a technique that a laser having its wavelength equal to or less than 1 $\mu m$ is applied to remove foreign matters adhering to a color filter, together with construction substance of the color filter, which is located adjacent the foreign matters.

By the way, if the portions of the photomask or the color filter, from which the foreign matters are removed, are left as they are, the portions are brought to falling conditions and form different defects. To this end, it is necessary to fill the falling portions with pattern material or other retouching materials. In retouching of the color filter, particularly, consideration must be made to uniformize membrane thickness of the filled retouching material to the thickness of the past pattern or the original pattern.

In this respect, Japanese Patent Unexamined Publication (Kokai) No. SHO 61-122605 discloses such a method that, as a technique in which breaking portions of pigments of a color filter are retouched or restored, an entire side of a substrate including a pigment layer is first coated with a photoresist, portions of the pigment layer including the breaking portions of the pigments are then removed together with the photoresist, by illumination of a laser, to expose a portion of the substrate, a pigment layer is then formed on the substrate by vacuum-deposition and, subsequently, residual photoresist is dissolved and removed. According to this method, it is possible to form, by vacuum-deposition, the pigment layer for retouching under the same condition as the past pigment layer to be retouched, thereby bringing the thickness of the pigment layer of the retouched portions substantially to the thickness of the past pattern.

In such retouching technique of the color filter, however, the retouching of the breaking portions of the pigments must be done for each color, that is, the retouching must be done in numbers corresponding to the colors such that a first pattern is formed, the first pattern is subsequently retouched, a second pattern is then formed, the second pattern is subsequently retouched and so on.

The inventors of this application have considered various methods which have more easily conduct retouching of an article having a plurality of types of patterns such as the color filter.

As a result, the inventors has noticed a method in which, after the plurality of types of patterns have all been formed, these patterns are retouched at once. In this method in which the patterns are retouched at once, a procedure is taken in which retouching material is partially filled in a plurality of portions to be retouched and that pattern portions different in type from each other, depending upon a place.

FIG. 2 shows a condition under which a foreign matter or the like is removed, and retouching material 2 is coated on a portion to be retouched in which one side of a substrate 1 is exposed. The retouching material 2 fills a defect portion of a pattern 3, and a part of the retouching material 2 adheres to an inner periphery of a retouching protective membrane 4 and an upper surface thereof.

A material section 2a on the retouching protective membrane 4 can be removed by removing the protective membrane 4. However, it is difficult to remove a material section 2b at a portion on the inner periphery of the protective membrane 4. As a result, there is a fear or likelihood that the material section 2b at the inner peripheral portion of the protective membrane 4 is left in the form of a projection at a peripheral edge portion of a material section 2c which fills the defect portion, so that the projection forms a new defect. In this respect, in case where the retouching protective membrane 4 is formed thick, concretely or definitely, to a value equal to or thicker than 1.5 $\mu m$, the thickness of the material section 2b remaining at the inner peripheral portion of the protective membrane 4 increases. Accordingly, when the pattern 3 is large in its thickness per se such as a color filter as compared with a case of a photomask, the above-described problem is more remarkable. Further, in case of the color filter, the projection mentioned above causes a display quality to be deteriorated so that its influence is large.

DISCLOSURE OF THE INVENTION

The invention has been done in consideration of the points described above, and it is an object of the invention to provide a technique in which an article in the form of a projection is difficult to occur at a peripheral edge portion of retouching material such as an ink which is partially filled in a defect portion of a pattern for retouching, so that the retouching can effectively be done.

According to the invention, there is provided a method of retouching a pattern formed on one side of a substrate and having partially defects, the method comprising:

(a) a first step of coating the one side of the substrate including the pattern, with a retouching protective membrane;

(b) a second step of exposing the one side of the substrate, with reference to portions having the defects;

(c) a third step of filling the portions of the exposed one side of the substrate, with retouching material; and (d) a fourth step of removing the retouching protective membrane, wherein one of the retouching protective membrane and the retouching material is made of water-soluble material, while the other is made of oil-soluble material.

In case where the retouching protective membrane and the retouching material are, for example, such that the former is oil-repellence and the latter is oil-soluble, the retouching material is difficult to adhere to an inner periphery of the protective membrane when the retouching material is coated and, accordingly, the article in the form of a projection mentioned previously is difficult to remain.

At this time, it is desirable that the retouching protective membrane is formed as thin as possible. For instance, in retouching of a color filter, the protective membrane is coated on the entire surface of the pattern. For this reason, it is superior that the thickness of the protective membrane is within a range of from 0.5 $\mu m \sim 2.0$ $\mu m$, more preferably, within a range of from 0.5 $\mu m \sim 1.5$ $\mu m$. Within this range, it is possible to restrain the height of the projection to a value equal to or less than 1.0 $\mu m$.

BEST MODE FOR CARRYING OUT THE INVENTION

Figure 1A:
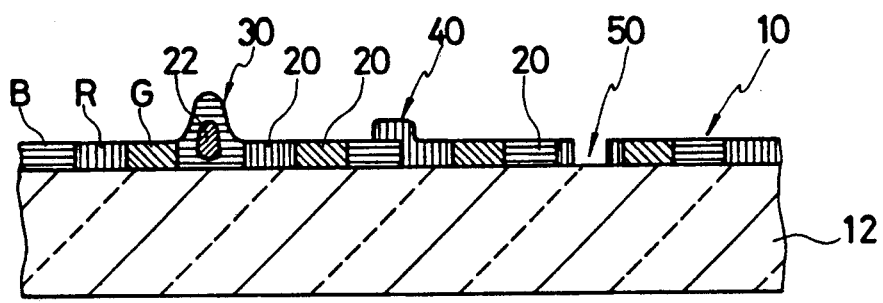
FIGS. 1a through 1e are a process diagram showing an embodiment of the invention.
Figure 1B:
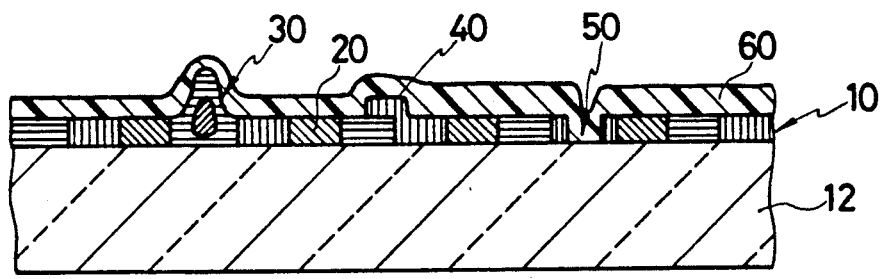
Figure 1C:
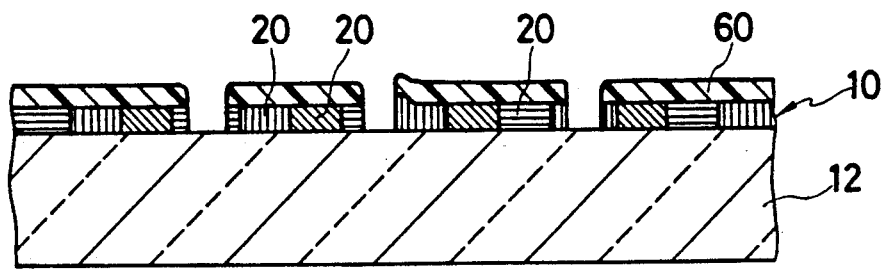
Figure 1D:
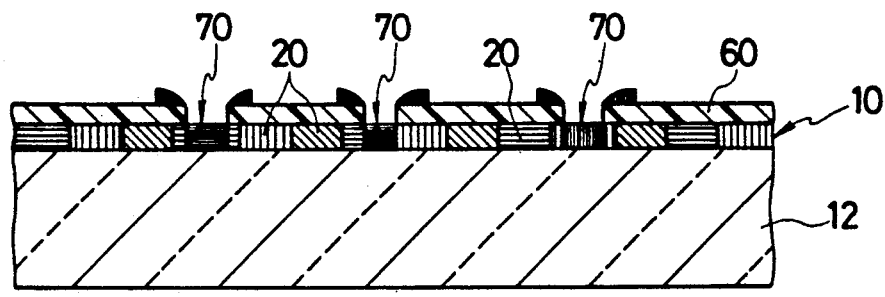
Figure 1E:
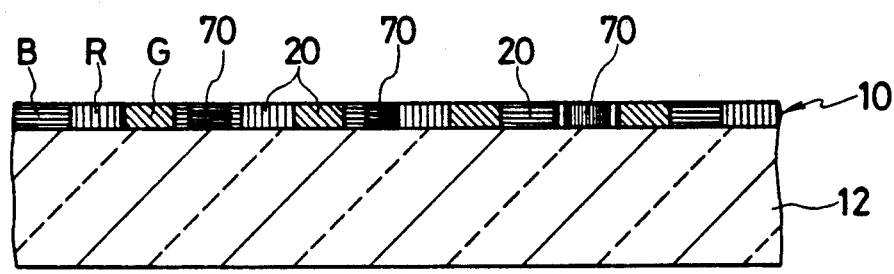
Figure 2:
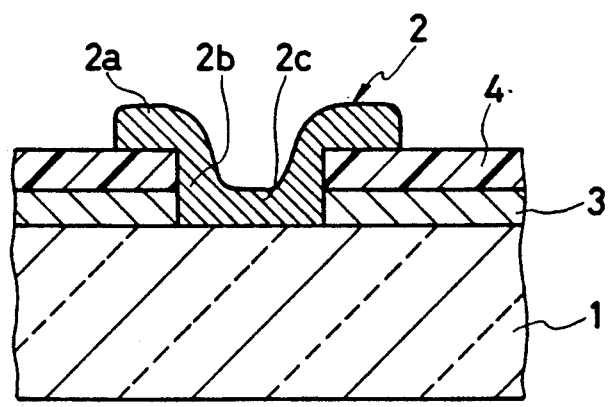
FIG. 2 is a partial cross-sectional view for explanation of a problem which is solved by the invention.

The invention will be described in more detail with reference to FIGS. 1a through 1e which show processes in order.

FIG. 1a

A subject to be retouched is a color filter 10. The color filter 10 has color picture elements 20 in three colors including red (R), green (G) and blue (B) that are three primary colors, on planar one side of a support substrate 12 which is made of a transparent glass plate or the like. Of course, as the case may be, light-shielding patterns of black or the like may be included at portions of the boundary among the color picture elements.

Three types of defects are seen at the color picture elements 20. One is a defect 30 due to a foreign matter, another is a defect 40 due to mixture of colors, and the other is a defect 50 due to falling. A cause of the first defect 30 is a foreign matter 22. The foreign matter 22 is a dust, a fragment of resin or the like which enters during manufacturing of the color filter 10. The size of the foreign matter 22 is a few micrometers to few tens of micrometers. If there is the defect 30 due to the dust, the fragment of resin or the like, the display quality of a liquid-crystal display panel is deteriorated and, further, when the height of the defect 30 increases to a value equal to or higher than gaps of liquid-crystal cells, the defect 30 also causes short-circuit. Further, the second defect 40 is a defect which occurs due to transfer of another color onto a portion except for a requisite portion, by contamination or the like of a photomask for manufacturing the color filter, or of a printing plate. For instance, the second defect 40 is such a condition that the color picture element 20 of blue (B) partially rests on the color picture element 20 of red (R). If such defect 40 increases a value equal to or larger than 20 $\mu m$, for example, it is possible to view the defect 40. The larger the defect 40 is, the less deteriorated will the quality display be. Further, the third defect 50 is a defect which occurs due to imperfection of the transfer of resin for the color filter, the photoresist or the like. The defect 50 also causes deterioration of the display quality.

Accordingly, such defects 30, 40 and 50 lower the yield of the color filter 10. In view of such defects, in order to improve the yield, or in order to obtain high-quality products, a retouching technique is utilized. In this connection, the color filter 10 is made such that material made of macromolecular substance is colored by dyes or pigments. The color filter 10 may be one which is made due to any known methods such as, for example, a dyeing method, a printing method, a method for patterning a coloring layer, or the like.

FIG. 1b

In retouching, the surface of the color filter 10 including the above-described defects 30, 40 and 50 is coated with a retouching protective membrane 60. As material of the protective membrane 60, material is used which is not violated by retouching material (ink) subsequently to be described.

In case where a retouching ink of oil-solubility is employed as the retouching material, resin of water-solubility is used for the protective membrane 60. For instance, in case where a coloring-polyimide retouching ink is used, gelatin, casein, PVA, gum arabic or the like is preferable for the protective membrane 60. A photoresist of solvent type is inadequate. It is also effective that an oil-repelling agent is added to the material for forming the protective membrane 60. Further, in order to enhance the sensibility or absorbency of the laser, dyes or compounds are added to the protective membrane 60 as the case may be.

Moreover, in case where a retouching ink of water-solubility is used, resin of oil-solubility is employed for the protective membrane 60. For instance, a gelatinous dye color filter is retouched by gelatin having added thereto dyes, OBC (trade name: Tokyo Ohkasha) or SILITECT (trade name: Trylaner Technologies Inc.) is preferable for the protective membrane 60. Among protective membranes of oil-solubility, SILITECT is superior as material having high water-repellence. Also in this case, it is effective that a water-repelling agent is added to the material which forms the protective membrane 60.

OBC is a rubber-type material for forming a protective membrane. SILITECT is a polyvinyl chloride acetate for forming a protective membrane.

The retouching protective membrane 60 can be formed by coating. As the coating method, various methods can be utilized such as spin coating, roll coating, brushing, printing, spraying and the like. Further, the entire surface of the color filter 10 may be coated with the protective membrane 60, or the peripheries of the respective defects may partially be coated with the protective membrane 60.

FIG. 1c

A laser is illuminated on the color filter 10 which is coated with the retouching protective membrane 60, whereby the surface of the support substrate 12, that is, the glass is exposed at the portions of the defects 30, 40 and 50.

As the laser used in the illumination, there are a $CO_2$ laser (wavelength: 10.6 μm), a laser within a visible range such as a second harmonic (wavelength: 0.53 μm) of a YAG:Nd laser, a xenon laser or the like, a laser within a ultraviolet range such as an excimer laser or the like. Among them, a laser within the visible range and within the ultraviolet range is preferable. In case of the $CO_2$ laser, energy is absorbed and is heated at the surface portion of the support substrate 12 of the color filter 10, so that the color picture elements 20 and the retouching protective membrane 60 are partially torn off. Over against this, in case of the laser within the visible range and the ultraviolet range, the color picture elements 20 tend to absorb the energy of the laser, so that the removing efficiency of the color picture elements 20 and the protective membrane 60 is superior. Accordingly, it is preferable also for the retouching protective membrane 60 that a wavelength portion of the used laser has an absorbency. In this connection, the portion of the defect 30 due to the foreign matter 22 has its surface which is in the form of a mountain centering around the foreign matter 22. Accordingly, it is preferable to remove a considerably wide area including the peripheral portion of the defect 30.

In connection with the above, a method of physically removing the defects by means of a needle or the like can also be utilized as a simple or easy method, though the method is not highly accurate more than the method which uses the laser.

FIG. 1d

The portions to be retouched, in which the surface of the support substrate 12 is exposed, are coated with retouching inks such as red, green and blue, so that the portions to be retouched are filled. At this time, since the portions to be retouched are considerably small in area, a layer 70 of the retouching inks is inevitably formed also on the retouching protective membrane 60. However, the retouching protective membrane 60 is formed thin, or the protective membrane 60 is given such a property that the material of the protective membrane 60 repels the layer 70 of the retouching inks, whereby an adhesive amount of inks on the inner peripheral portion of the protective membrane 60 can considerably be reduced. Further, a glass plate is generally used as the support substrate 12. In case where the portions, in which holes or bores are formed by the laser, are simply filled with the retouching inks, however, wettability of the retouching inks is different between the glass surface of the bottom of the bore and the surface of the retouching protective membrane 60. Accordingly, there is a case where the retouching inks do not uniformly adhere to the portions to be retouched with a uniform thickness. In this case, it is preferable that, prior to coating of the retouching inks, pretreatment is done by dilution liquid of the retouching inks, liquid in which resin of the retouching inks is diluted, or dilution liquid of resin improving adhesiveness between the support substrate 12 and the retouching inks.

Fundamentally, as the inks that are the retouching material, it is preferable that material the same as the color picture elements 20 to be retouched is selected. However, the material is not limited to the same material. Also, it is preferable that the inks are the same in color as far as possible. However, no problem occurs if the inks are substantially the same in color as each other. A retouching process can be simplified if a plurality of retouching portions positioned at a plurality of locations are filled with an ink of a single black color or metal such as chromium or the like, for example.

As the filling method of the retouching inks, various methods are used such as brushing, printing, spraying, spin coating or the like. Among them, the spin coating method is most adequate in that the membrane thickness of the filling portions can be uniformized to the thickness of the color picture elements 20. In this spin coating method, an injection needle is used, for example, to drip a predetermined amount of retouching ink on the filling portions and, subsequently, the support substrate 12 rotates, whereby the retouching ink of the filling portion is uniformized in thickness to the color picture elements 20. In this connection, since the retouching portion is extremely small in area, it is possible to coat the retouching ink partially and, accordingly, it is also possible to treat a plurality of color inks at once. Of course, a portion, which is smaller in area than the size of the color picture elements 20 and which does not cause any problem in the quality, does not require retouching.

FIG. 1e

The retouching protective membrane 60 is removed, whereby the retouching inks 70 remain only on the portions to be retouched. As a method of removing the protective membrane 60, it is possible to use a method of washing the protective membrane 60 by solvent or water, a method of tearing the protective membrane 60 from the surface of the substrate 10 by physical means, or the like.

Further, when the surface of the support substrate 12 is exposed by illumination of the laser, there is a case where the edge portions of the respective defects and, as the case may be, the edge of each retouching portion exceeds, in height, the cell gaps of the liquid-crystal panel, for example, 5 μm. In this case, it is preferable that the laser is again applied to the portion having its high edge, to remove the portion having its high edge. If the laser is narrowed or squeezed to a spot, for example, of the order of 2 μm~3 μm, the removed area due laser is small, so that, practically, no problem In connection with the above, as the retouching material, it is possible also to use resin of achromatophilia. In this case, the photo-sensitive resin filled in the locations to be retouched is spot-exposed, whereby the photo-sensitive resin can remain only on the defect portions. Subsequently, the remaining photo-sensitive resin is dyed, and the retouching membrane is then removed, whereby the retouching is completed.

Moreover, in case where material, in which a coloring agent such as dyes, pigments or the like is mixed with resin such as polyimide or the like is used as the pattern material and the retouching material, organic-inorganic transparent coating material such as, for example, JHR (trade name: Nippon Gosei Gomu Kabushiki Kaisha) can be used as material of the retouching protective membrane. JHR is a silicone-modified forming a protective membrane. The JHR is superior to adhesiveness with respect to the glass of the substrate, whereas the JHR is inferior to adhesiveness with respect to colored polyimide or the like. Accordingly, after the retouching material has been filled, it is possible to beautifully remove the retouching protective membrane by the use of an adhesive tape or the like.

As described above, according to the invention, one of the retouching protective membrane 60 and the retouching material 70 is made of water-soluble material, while the other is made of oil-soluble material. Accordingly, no article like a projection having its high back remains on the peripheral edge portion of the retouching material such as an ink or the like, which is filled in the retouching portions, so that it is possible to freely adjust the membrane thickness of the retouching portions thereby effectively retouching the pattern. Particularly, more remarkable advantages are obtained if the invention is applied to the pattern having its large in membrane thickness, for example, to a color filter for use in a color liquid-crystal display panel. Further, the invention also obtains such advantages that, in case where the invention is applied to retouching of an article having a plurality of types of patterns such as a color filter, the plurality of types of patterns can simultaneously be retouched by once retouching treatment.

EXAMPLE 1

Retouching of Color Filter Which Uses Colored Polyimide

Aqueous solution of 10% of PVA (polyvinyl alcohol), in which a slight amount of acid rhodamine B was dissolved, was coated on a color filter by means of spin coating. Subsequently, the aqueous solution was baked at 120° C. for 5 minutes, thereby retouching protective membrane having its thickness of 1.5 μm.

Subsequently, a second harmonic of a YAG:Nd laser is pulse-applied to a retouching portion having a defect, to form a bore in the retouching protective membrane and the color filter, thereby exposing a glass surface. A single drop of a polyimide retouching ink of oil-solubility for red was dripped onto the retouching portion, to smooth the latter by the spin coating. After baking has had been done at 150° C. to harden retouching ink and, subsequently, the latter was rinsed by water. Then, a smooth ink layer of red remains only on the retouching location, and the remaining portion was rinsed together with the protective substrate. This was further baked at 250° C. to completely harden retouching portion of polyimide, thereby completing the retouching operation.

EXAMPLE 2

Retouching of Gelatinous Dyeing Color Filter

SILITECT was coated on a color filter by means of spraying. Subsequently, a xenon laser was applied to a retouching portion having a defect to form a bore, thereby exposing a glass surface.

A retouching ink layer for blue, in which blue dyes were added to gelatinous aqueous solution, was formed by means of spin coating. After air drying, the SILITECT layer was peeled off from the color filter by the use of an adhesive tape. At the time of this peeling, the excess ink layer was also removed together with the SILITECT layer. Baking was done at 160° C. harden the retouching ink, thereby completing the retouching operation.

At this time, since the SILITECT was coated by means of the spraying, the SILITECT was considerably thickened. Since, however, the SILITECT per se has its water-repellence, no problem occurs on a projection around the peripheral edge portion of the retouching pattern.

INDUSTRIAL APPLICABILITY

As described above, the invention is useful as a retouching technique of a pattern in a photomask, a color filter or the like. Particularly, the invention is preferable for retouching of an article having a plurality of patterns each of which is relatively large in membrane thickness, like the color filter.

What is claimed is:

1. A method of retouching a pattern formed on one side of a substrate for a color filter, the pattern to be retouched being a plurality of color picture elements of the color filter, the pattern having defects, said method comprising:
    (a) a first step of coating the side of the substrate having the pattern with a retouching protective membrane;
    (b) a second step of exposing the substrate at those portions of the substrate having the defects to remove the defects;
    (c) a third step of coating the exposed portions of the substrate simultaneously with several different colored retouching materials in order to partially coat the substrate only at the exposed portions of the substrate, each of the exposed portions being filled with the retouching material which is similar in color to one of the plurality of color picture elements, the coating being accomplished by adhering the retouching material to the substrate and subsequently rotating the substrate;
    (d) a fourth step of removing the retouching protective membrane, wherein the retouching protective membrane is comprised of a material selected from the group consisting of a water soluble material and an oil soluble material and if the retouching protective membrane is a water soluble material the retouching material is an oil soluble material and if the retouching protective membrane is an oil soluble material the retouching material is a water soluble material.

2. A method of retouching a pattern according to claim 1, wherein a water-soluble material forms the retouching protective membrane and has oil-repellency.

3. A method of retouching a pattern according to claim 1, wherein an oil-soluble material forms the retouching protective membrane, and has water repellency.

4. A method of retouching a pattern according to claim 1, wherein a water-soluble material forms the retouching protective membrane and is made of material including an oil-repelling agent, and an oil-soluble material is used as the retouching material.

5. A method of retouching a pattern according to claim 1, wherein an oil-soluble material forms the retouching protective membrane, and is made of material including a water-repelling agent.

6. A method of retouching a pattern according to claim 1 wherein the retouching material adheres to a predetermined portion of the substrate and has a thickness and the substrate is rotated in order to control the thickness of the adhering retouching material as the retouching material is coated and adheres to a predetermined portion of the substrate.

7. A method of retouching a pattern according to claim 1 wherein, prior to coating the retouching material, a pretreatment increasing the adhesiveness between the retouching material and the substrate is applied to the substrate.

8. A method of retouching a pattern according to any one of claims 1, 2, 3, 4, 5, 6 or 7 wherein the retouching protective membrane has a membrane thickness which is within a range of from 0.5 μm to 2.0 μm.

9. A method of retouching a pattern according to claim 1, wherein the exposing of the substrate is effected by means of a laser operating at a wavelength which is absorbed by the retouching protective membrane, the exposing occurring on the upper surface of the substrate.

10. The method as set forth in claim 1 wherein a predetermined amount of retouching material is coated on the substrate by dripping the predetermined amount of the retouching material on the exposed portions of the substrate and subsequently rotating the substrate.

* * * * *